(12) United States Patent
Yamamoto et al.

(10) Patent No.: US 6,740,623 B2
(45) Date of Patent: May 25, 2004

(54) OXIDE SUPERCONDUCTOR AND METHOD FOR PRODUCING SAME

(75) Inventors: Ayako Yamamoto, Tokyo (JP); Wei-Zhi Hu, Tokyo (JP); Setsuko Tajima, Tokyo (JP)

(73) Assignee: International Superconductivity Technology Center, Tokyo (JP)

( * ) Notice: Subject to any disclaimer, the term of this patent is extended or adjusted under 35 U.S.C. 154(b) by 0 days.

(21) Appl. No.: 10/350,718

(22) Filed: Jan. 24, 2003

(65) Prior Publication Data

US 2003/0144149 A1 Jul. 31, 2003

Related U.S. Application Data

(62) Division of application No. 09/517,859, filed on Mar. 3, 2000, now Pat. No. 6,537,949.

(30) Foreign Application Priority Data

Mar. 5, 1999 (JP) .............................................. 11-58784

(51) Int. Cl.[7] .............................................. C04B 101/00
(52) U.S. Cl. ........................ 505/126; 505/776; 505/779
(58) Field of Search ................................ 505/126, 776, 505/779

(56) References Cited

U.S. PATENT DOCUMENTS

| | | | | |
|---|---|---|---|---|
| 5,019,555 A | * | 5/1991 | Chin et al. | ...................... 505/1 |
| 5,650,376 A | * | 7/1997 | Badaye et al. | .............. 505/238 |
| 6,063,735 A | * | 5/2000 | Park et al. | .................. 505/125 |

OTHER PUBLICATIONS

Aldrich "Products for Superconductivity Research" 1990–1991, p. 17.*

* cited by examiner

*Primary Examiner*—Mark Kopec
(74) *Attorney, Agent, or Firm*—Flynn, Thiel, Boutell & Tanis, P.C.

(57) ABSTRACT

An Hg- or Nd-based oxide superconductor comprises Ba as a constituent element and has a content of carbon as an impurity at a level of not greater than 2.0 atomic % whereby the oxide superconductor stably shows high superconducting characteristics without causing degradation with time. For its production, BaO, which has a reduced content of carbon impurity of 0.5% or below, is provided as a feed stock for Ba, and the starting materials are mixed and processed in a dry atmosphere wherein an amount of a carbon-containing gas is suppressed to a certain level, thereby obtaining the oxide superconductor.

4 Claims, 2 Drawing Sheets

OXIDE SUPERCONDUCTOR AND METHOD FOR PRODUCING SAME

This is a division of Ser. No. 09/517,859, filed Mar. 3, 2000 now U.S. Pat. No. 6,537,949.

BACKGROUND OF THE INVENTION

1. Field of the Invention

This invention relates to an oxide superconductor comprising Ba as a constituent element and which has excellent superconducting characteristics and a high characteristic stability with time, and also to a method for producing the oxide superconductor.

2. Description of the Prior Art

Oxide superconductor materials having a relatively high superconducting critical temperature, such as $LiTi_2O_3$, $Ba(Bi, Pb)O_3$, $(Ba, K)BiO_3$ and the like, have been recently found. Since then, copper oxide superconducting materials having such a high critical temperature, as would never have been expected, have been successfully prepared. Among them, a number of "oxides containing Ba as constituent element" have been found as exhibiting a high superconducting critical temperature and a high critical current density.

Such an oxide superconductor containing Ba as a constituent element includes, aside from the ones set out above and found relatively at an initial stage, $LnBa_2Cu_3O_y$ oxides (wherein Ln stands for one or more of lanthanides) such as $YBa_2Cu_3O_y$, $Nd(Nd_{1-x}Ba_x)_2Cu_3O_{6+\delta}$ ($x \leq 1$) and the like, and oxides of $CuBa_2Ca_{n-1}Cu_nO_y$ (n=3 or 4), $TlBa_2Ca_{n-1}Cu_nO_y$ (n=1, 2, 3 or 4), $Tl_2Ba_2Ca_{n-1}Cu_nO_y$ (n=1, 2, 3 or 4) $HgBa_2Ca_{n-1}Cu_nO_y$ (n=1, 2, 3 or 4) or the like.

All of these oxide superconductors have a high superconducting critical temperature higher than a liquid nitrogen temperature, and their applications and developments as a bulk material, a wire material and a device are now in progress.

For the production of these oxide superconductors, there has been used a procedure which comprises providing, as feed stocks of individual constituent elements, carbonates and oxides which are relatively stable in air {e.g. commercially available $Ln_2O_3$ (wherein Ln means one or more of rare earth elements such as La, Nd, Y, Sm and the like), $ACO_3$ (wherein A means Ba, Sr, Ca and the like), CuO and the like}, and weighing these materials at predetermined ratios, followed by mixing, shaping, sintering and cooling (gradual cooling or quenching) to provide an oxide superconductor. It will be noted that after the sintering and cooling, milling, mixing, shaping, sintering and cooling steps have been sometimes repeated several times. Moreover, the resultant oxide is further subjected to the step of thermal treatment (annealing treatment) in an atmosphere of oxygen or the like.

In this case, there have been frequently employed, as the feed stock for Ba, not only $BaCO_3$ mentioned above, but also $BaO_2$ or BaO, or oxides which are obtained by adding, to these oxides, carbonates or oxides of Y, Ca, Cu, Nd and the like and calcining the mixtures (the calcined oxide is hereinafter referred to as "Ba-containing precursor").

However, it has been often criticized that such an oxide superconductor containing Ba as the constituent element is poorer in stability over time of superconducting characteristics than Ba-free oxide superconductors {e.g. $(La,Sr)_2CuO_y$, $Bi_2Sr_2CaCu_2O_y$ and the like}.

It has also been pointed out that these oxide superconductors containing Ba as the constituent element are more apt to cause, more or less, a lot of variation in ultimate superconducting characteristics than Ba-free oxide superconductors.

These inconveniences become more pronounced with the case of Hg-based oxide superconductors and Tl-based oxide superconductors, and cannot be overlooked in the case of Nd-based oxide superconductors, for which studies on their practical applications have now undergone a marked development.

SUMMARY OF THE INVENTION

It is accordingly an object of the invention to provide an oxide superconductor containing Ba as a constituent element, which stably shows good superconducting characteristics without degradation over time.

We made intensive studies in order to achieve the above object and, as a result, found the following.

a) Because $BaCO_3$, BaO or $BaO_2$ is used as a feed stock for the production of an oxide superconductor containing Ba as a constituent element, it is difficult to prevent the incorporation of carbon (C) as an impurity element. More particularly, where $BaCO_3$ is provided as a feed stock for Ba, there is the apprehension of the danger that C will be incorporated therein upon decomposition of $BaCO_3$. On the other hand, when BaO or $BaO_2$ is used as a Ba feed stock, BaO, which is a very unstable compound, is very liable to combine with a carbon-containing gas, such as carbon dioxide or the like, existing in the atmosphere. Moreover, with $BaO_2$, which is usually prepared from BaO as an intermediate material, it is difficult to prevent contamination with a carbon-containing gas through the intermediate material. As a consequence, approximately 1 atomic % (hereinafter referred to simply as % unless otherwise indicated) or more of carbon (C) is incorporated in these starting materials. This eventually permits a substantial amount of carbon (exceeding 2.0%) to be incorporated in an oxide superconductor product through the Ba feed stock along with other contamination during a series of oxide superconductor producing steps.

Especially, where Hg-based oxide superconductors and Tl-based oxide superconductors using high volatilization Hg and Tl, respectively, are produced, heating at a high temperature causes Hg or Ti to evaporate, thereby resulting in crystal lattice defects. In this sense, $BaCO_3$, which is a relatively stable compound and, hence, should be thermally decomposed through a heating treatment at high temperatures to remove the C component, cannot be used. In contrast, BaO, i.e. a compound which is unstable and liable to undergo contamination, has to be used as a Ba feed stock. In the Hg-based or Tl-based oxide superconductors, this makes it more difficult to prevent the incorporation of carbon (C) as an impurity.

In this connection, the carbon incorporated in the oxide superconductor may be partially substituted with a constituent element (e.g. Hg, Tl, Nd or the like) in the crystal lattices of the oxide superconductor to give a strain thereto, or may segregate at the grain boundary when the oxide superconductor is made of a polycrystal. This will cause the degradation of superconducting characteristics and their stability with time of the oxide superconductor.

b) However, when the content of the carbon incorporated, as an impurity, in an oxide superconductor product is reduced to a level of 2.0% or below, the superconducting critical temperature increases for the same type of oxide superconductor along with a marked improvement in the characteristic stability with time.

c) In a hitherto adopted procedure of producing an ordinary oxide superconductor, it has been very difficult to suppress the carbon content in the resulting oxide superconductor product to 2.0% or below. However, when using a conventional procedure wherein there is employed, as a feed stock for Ba, BaO which is prepared under specific conditions and purified satisfactorily so that the content of carbon is reduced to 0.5% or below, the carbon incorporated in the oxide superconductor product as an impurity can be significantly reduced. This enables one to obtain an oxide superconductor product having a carbon content of 2.0% or below, high critical current density and high stability with time.

d) In the case, when the starting materials for oxide superconductor are mixed in a dry atmosphere having a content of a carbon-containing gas, such as carbon dioxide or the like, at 10 ppm or below, preferably 1 ppm or below, and subsequent steps of producing an oxide superconductor are carried out while being isolated from both a carbon-containing gas and moisture, it becomes more preferred for the stable production of a high-performance product.

The invention has been accomplished based on the above findings and provides the following oxide superconductor and a method for producing same.

(1) An oxide superconductor of the type which comprises Ba as a constituent element, characterized in that the content of carbon as an impurity is suppressed to a level of 2.0% or below.

(2) An oxide superconductor of the type which comprises Ba as a constituent element as recited (1) above, wherein the superconductor consists of an oxide of the chemical formula $HgBa_2Ca_{n-1}Cu_nO_y$ 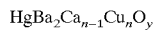

wherein n=1, 2, 3 or 4 and y=2n+2+δ.

An oxide superconductor of the type which comprises Ba as a constituent element as recited in (1) above, wherein the superconductor consists of an oxide of the chemical formula $Nd(Nd_{1-x}Ba_x)_2Cu_3O_{6+\delta}$ 

wherein x≦1.

A method for producing an oxide superconductor recited in any one of (1) to (3) above, which method comprising mixing starting materials containing individual constituent elements, shaping, heating and cooling to prepare an oxide superconductor, characterized in that a feed stock for Ba consists of BaO which has a content of a carbon impurity of not greater than 0.5%.

(5) A method for producing an oxide superconductor recited in (4) above, characterized in that all the steps of from the mixing of the feed stocks to the production of the oxide superconductor, are performed in a dry atmosphere whose content of a carbon-containing gas is limited to a level of 10 ppm or below.

EMBODIMENTS OF THE INVENTION

Figure 1:
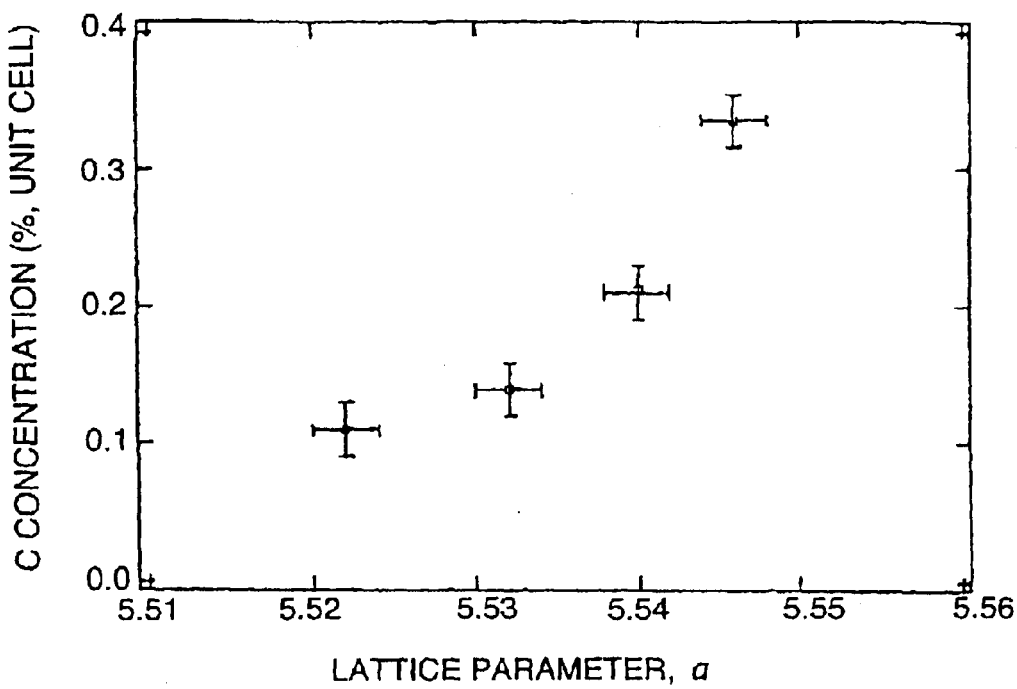
FIG. 1 is a graph showing the relationship between the measurements of a lattice constant of BaO preparation in the Examples and the residual carbon content.

The "oxide superconductor containing Ba as a constituent element", to which the invention is directed, may be any types of known oxide superconductors including, for example, $LnBa_2Cu_3O_y$ oxides (wherein Ln stands for at least one lanthanide), such as $YBa_2Cu_3O_y$, $Nd(Nd_{1-x}Ba_x)_2Cu_3O_{6+\delta}$ wherein x≦1 and the like, $CuBa_2Ca_{n-1}Cu_nO_y$ wherein n=3 or 4, $TlBa_2Ca_{n-1}Cu_nO_y$ wherein n=1, 2, 3 or 4, $Tl_2Ba_2Ca_{n-1}Cu_nO_y$ wherein n=1, 2, 3 or 4, $HgBa_2Ca_{n-1}Cu_nO_y$ wherein n=1, 2, 3 or 4 and y=2n+2+δ, and the like. The effects of the invention become more pronounced when applied to Hg-based oxide superconductors and Tl-based oxide superconductors, with which it has been difficult to obtain products whose characteristics are stable although they are expected to have excellent superconducting characteristics, or also to Nd-based oxide superconductors which are under progressive study for practical application as a high-performance product.

The reasons why the Ba-containing oxide superconductors according to the invention are improved in superconducting characteristics and their stability with time are considered to be as follows.

Carbon (C), which is an impurity element that is liable to be incorporated in the Ba-containing oxide superconductor in a large amount, is apt to be taken in the crystals after partial substitution with the constituent elements (Hg, Tl, Nd and the like) of the oxide superconductor. Among the elements, Hg and Tl, respectively, have a low boiling point and suffer easy dissipation by evaporation, so that they are very liable to be substituted with C. The shifting at the atom position within the crystal structure, which is caused by the substitution, leads to the lowering of the superconducting critical temperature.

Moreover, where the oxide superconductor is in the form of a polycrystal, the C impurity is apt to segregate at the grain boundary, thereby causing the lowering and degradation with time of the superconducting critical temperature. In particular, a compound containing Ba is likely to absorb carbon dioxide and moisture in air, and these substances are concentrated at the grain boundary, so that the bonding of the grains are weakened, thereby causing the superconducting characteristics and stability with time to degrade.

In this connection, however, when the content of the impurity C in the oxide superconductor is reduced to 2.0% or below, the amount of the carbon element, which is substituted with the constituent elements of an oxide superconductor or segregates at the grain boundary, is significantly reduced. Thus, the adverse influence of the carbon element does not become appreciable, thus leading to the improvement in the superconducting critical temperature and stability with time.

In this case, a lower content of carbon serving as an impurity element is more preferred. Taking into account the manner of production and production costs, an extreme reduction in the amount of carbon is not convenient in practice, and it is sufficient to reduce the carbon content within a range of approximately 2.0 to 0.3%.

For carrying out the hitherto employed procedure of producing an oxide superconductor containing Ba as a constituent element by mixing starting materials containing the respective constituent elements (e.g. mixing, with BaO, of at least one of HgO, CaO, CuO, $Tl_2O_3$ and oxides of rare earth elements) shaping, heating and cooling, it is essential for the production of the oxide superconductor of the invention to use BaO, in which the content of a carbon impurity is reduced to 0.5% or below, as a feed stock for Ba.

It will be noted that we have experimentally found that BaO, in which the content of a carbon impurity is reduced to 0.5% or below, is obtained by thermally treating $BaCO_3$ having a purity of 99.99% under a vacuum of not higher than $10^{-2}$ Torr at a temperature of not lower than 1000° C. In this connection, when the thermal treating temperature is lower than 950° C., $BaCO_3$ does not undergo a complete decomposition with part thereof being left. In addition, when the degree of vacuum is not satisfactory and exceeds $10^{-2}$ Torr., $BaCO_3$ remains if the thermal treating temperature is elevated. In either case, it is not possible to obtain BaO of a desired high purity.

Although the measurement of the carbon content of BaO may be performed according to an IR spectroscopic absorption method or the like, it is preferred to use "a method of analyzing a residual amount of an impurity element" determined from the lattice constant obtained by powder X-ray diffraction and developed by us. This method is based on the principle that there is a certain interrelation between the lattice constant actually measured according to the powder X-ray diffraction technique and the residual amount of an impurity element, from which the residual amount of the impurity element is assessed from the lattice constant determined by the X-ray diffraction. The method is a favorable procedure of measuring a residual amount of an impurity element left in a purified element or a compound thereof.

When the steps of from the mixing of the starting material until the formation of an oxide superconductor is carried out in a dry atmosphere wherein a carbon-containing gas is suppressed to a level of 10 ppm or below, it becomes possible to more stably produce a Ba-containing oxide superconductor of the invention wherein the content of a carbon impurity is 2.0% or below. Preferably, the content of a carbon-containing gas in the atmosphere is 1 ppm or below. In this way, the production of the Ba-containing oxide superconductor having an impurity carbon content of 2.0% or below according to the invention is more stabilized.

The carbon-containing gas bringing about the carbon contamination includes carbon dioxide stably existing in air, to which the greatest attention should be paid, and care should also be drawn to a hydrocarbon gas or carbon monoxide.

It is recommended as a specific procedure of carrying out the above method to use a method which comprises mixing starting materials in a globe box filled, for example, with a dried inert gas (such as Ar gas or the like) of high purity wherein a carbon-containing gas is present in an amount of 0.1 ppm or below, encapsulating the resultant mixture in the globe box in a non-reactive container such as a quartz tube or the like, and heating the mixture along with the closed container.

The invention is more particularly described by way of examples.

EXAMPLE 1

Commercially available $BaCO_3$ having a purity of 99.99% was provided, and heated and calcined at different reduced pressures and heating temperatures to prepare BaO, which was one of the starting materials for the production of oxide superconductors. In the heating and calcining treatment, three cycles of calcination were carried out including pulverizing a calcined product obtained by the first heating and calcining step, heating and calcining the resultant powder under the same conditions as in the first step, and repeating the above steps once again.

In Table 1, the degree of vacuum, and calcining temperature and time (a total calcination time of the three heating and calcining treatments) at the time of the production of BaO are shown, along with the content of carbon in the resultant BaO and a measurement of lattice constant.

The content of carbon in BaO was measured according to an IR spectroscopic absorption method, and the lattice constant was measured according to the powder X-ray diffraction method.

TABLE 1

| BaO obtained under different conditions | Production Conditions | | | Measurements on BaO | |
|---|---|---|---|---|---|
| | Degree of Vacuum (Torr) | Calcining Temperature (° C.) | Calcining Time (hours) | Carbon Content (atomic %) | Lattice Constant (Å) |
| A | $10^{-2}$ | 1070 | 40 | 0.11 | 5.522 |
| B | $10^{-2}$ | 1050 | 40 | 0.14 | 5.532 |
| C | $10^{-2}$ | 1020 | 40 | 0.21 | 5.540 |
| D | $10^{-2}$ | 1000 | 40 | 0.34 | 5.546 |
| E | $10^{-1}$ | 1000 | 40 | 0.80 | — |
| F | $10^{-2}$ | 900 | 40 | 1.50 | — |
| G | $10^{-2}$ | 850 | 40 | 3.50 | — |

(Note) The mark "—" in the "Lattice Constant" means that because the presence of residual $BaCO_3$ by mixing with BaO was confirmed, the lattice constant was not measured.

The results shown in Table 1 reveal that when $BaCO_3$ of high purity is calcined at a high degree of vacuum at a high temperature (e.g. thermally treated under a reduced pressure of about $10^{-2}$ Torr at about 1000° C. or over), BaO of such a high purity that the content of impurity carbon is lower than 0.5% can be obtained.

In view of the relation between the carbon content in BaO and the lattice constant of BaO, which can be confirmed from the results of Table 1, it will be seen that the small amount of carbon contained in the structure of BaO is estimated from the measurement of the lattice constant of BaO.

FIG. 1 is a graph showing the relation between the measurement of the lattice constant of BaO and the residual carbon content shown in Table 1. From FIG. 1, it can be confirmed that a certain interrelation is established between the measurement of the lattice constant determined from X-ray diffraction of BaO and the residual carbon content.

Next, individual BaO products having different C contents obtained in a manner stated above were, respectively, provided as a Ba feed stock to attempt the production of an oxide superconductor, $HgBa_2CuO_{4+\delta}$.

For the production of the oxide superconductor, $HgBa_2CuO_{4+\delta}$, commercially sold HgO powder and CuO powder were, respectively, provided, with which a BaO powder indicated in Table 1 (i.e. one of A to G) was mixed in a globe box filled with a highly pure, dried Ar gas having a content of carbon-containing gases (i.e. carbon dioxide, carbon monoxide and a hydrocarbon gas) of 0.1 ppm or below at compositional ratios of HgO:BaO:CuO=1:2:1. The mixture was shaped, and the resultant shaped body was encapsulated in a quartz tube in vacuum (with a degree of vacuum of $10^{-2}$ or below), followed by heating and sintering in a box-shaped electric furnace at different temperatures for a sintering time of 20 hours and quenching by immersion in cold water at 10° C.

After the quenching, the quartz tube was opened, and the resultant oxide superconductor was annealed in an atmosphere of oxygen at 300° C for 3 days in an ordinarily employed manner.

The respective $HgBa_2CuO_{4+\delta}$ oxide superconductors (products) prepared in this way were subjected to measurement of a content of a carbon impurity therein (which was considered as incorporated in association with HgO and CuO, not to mention BaO, and as incorporated at a level of about 0.7% from the environment. Moreover, the superconducting critical temperature and its stability with time of the oxide superconductors (products) were checked. These results are shown in Table 2 along with the preparing conditions of the oxide superconductors.

It will be noted that the carbon content in the $HgBa_2CuO_{4+\delta}$ oxide superconductors (products) was measured according to the IR spectroscopic absorption method.

The superconducting critical temperature was determined as follows: a DC magnetic susceptibility was measured by means of a SQUID magnetometer, and a maximum temperature at which a diamagnetic signal was detected was determined as a superconducting critical temperature.

Further, the stability with time was determined as follows: a powder sample was prepared from each of the $HgBa_2CuO_{4+\delta}$ oxide superconductors (products), placed in a simple desiccator and preserved at room temperature for 3 months, and subjected to powder X-ray diffraction; and the stability was judged depending on the incorporated amount of a decomposition product, such as $BaCO_3$, which was estimated from the intensity ratio of powder X-ray diffraction images.

In Table 2, the stability is indicated as "very good" when the amount of the decomposition product estimated from the intensity ratio of the powder X-ray diffraction images is 1% or below, as "good" for 1 to 3%, as "moderate" for 3 to 5%, as "poor" for 5 to 10%, and as "very poor" for 10% or above.

TABLE 2

| | | Starting BaO used | Preparation Conditions of Oxide Superconductor | | Measurements and Evaluation of Products Obtained Super-conducting | | |
|---|---|---|---|---|---|---|---|
| Test No. | | (symbols in Table 1) | Sintering Temperature (° C.) | Sintering Time (hours) | Carbon Content (atomic %) | Critical Temperature (K) | Stability with Time |
| Inventive Example | 1 | A | 800 | 20 | 0.86 | 98.0 | Very good |
| | 2 | B | 800 | 20 | 0.88 | 97.0 | Very good |
| | 3 | C | 750 | 20 | 0.98 | 96.0 | Good |
| | 4 | D | 800 | 20 | 1.04 | 95.0 | Good |
| Comparative Example | 5 | E | 800 | 20 | 2.10 | 94.0 | Moderate |
| | 6 | F | 750 | 20 | 2.20 | 93.0 | Poor |
| | 7 | G | 700 | 20 | 4.20 | 93.0 | Poor |

From the results of Table 2, it will be apparent that the $HgBa_2CuO_{4+\delta}$ superconductors, which have a low content of the carbon impurity, are better than the comparative products, which have a carbon content higher than 2.0%, with respect to the superconducting characteristics (superconducting critical temperature and stability with time).

Figure 2:
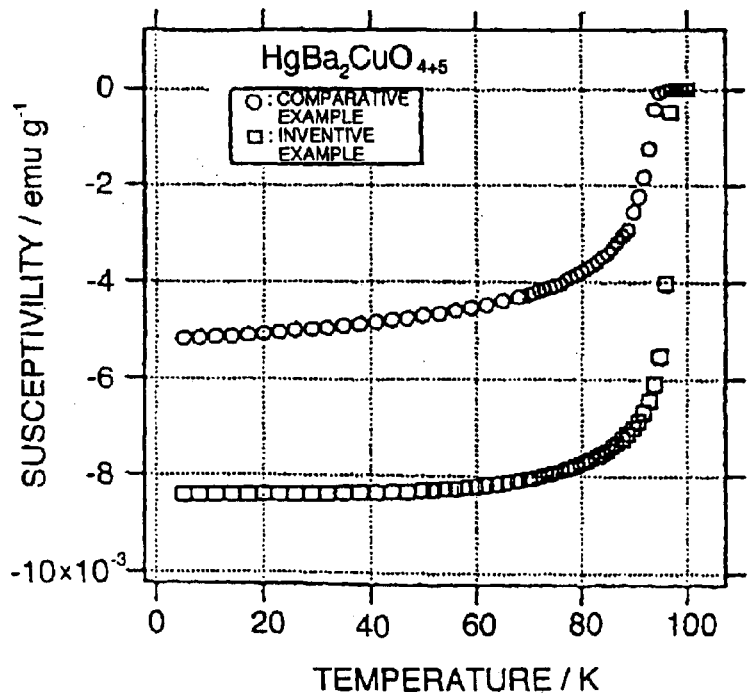
FIG. 2 is a graphical representation of a superconducting characteristic of an oxide superconductor of the formula, $HgBa_2CuO_{4+\delta}$ obtained in an inventive example, compared with that of an oxide superconductor of the formula, $HgBa_2CuO_{4+\delta}$ obtained in a comparative example.
Figure 3:
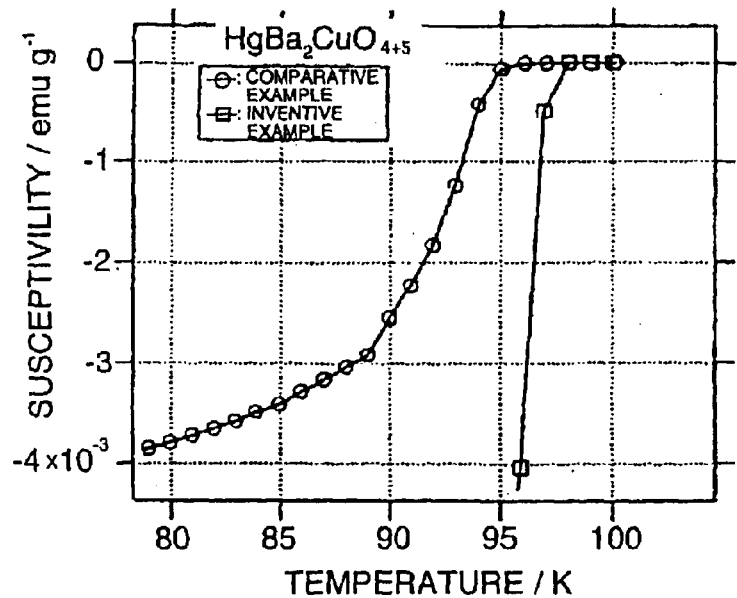
FIG. 3 is a graph showing the variation in susceptibility of FIG. 2 in the vicinity of a superconducting critical temperature.
Figure 4:
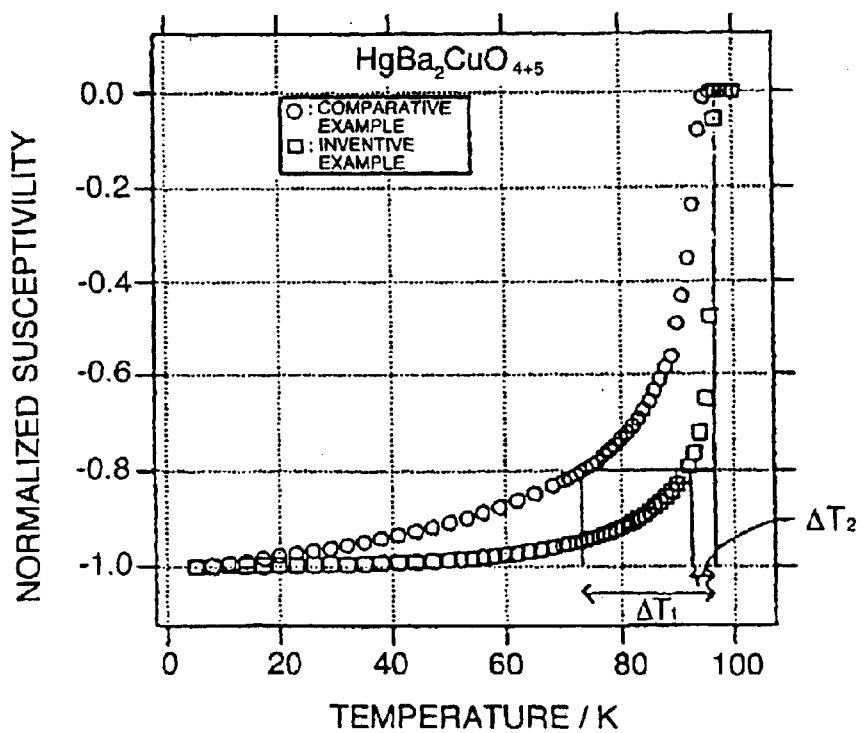
FIG. 4 is a graph showing the variation, at different temperatures, in measurements of susceptibility which are relative to an index of susceptibility=−1.0 at a temperature of 5K for the oxide superconductor of $HgBa_2CuO_{4+\delta}$ obtained in an inventive example and the oxide superconductor of $HgBa_2CuO_{4+\delta}$ obtained in a comparative example.

It will be noted that FIGS. 2 to 4 are, respectively, a graph showing the superconducting characteristics of the $HgBa_2CuO_{4+\delta}$ oxide superconductor (i.e. the product of Test No. 1) according to the invention and that of $HgBa_2CuO_{4+\delta}$ oxide superconductor (i.e. the product of Test No. 5) for comparison.

More particularly, FIG. 2 shows the variation of susceptibility over a wide temperature range, which was experimentally confirmed. FIG. 3 shows a more detailed variation of the susceptibility in the vicinity of the superconducting critical temperature. FIG. 4 shows the variation, at different temperatures, of relative values of susceptibility based on the index of the susceptibility determined at −1.0 at a temperature of 5° K for the respective samples (i.e. the product obtained in Test No. 1 and the product obtained in Test No. 5) for comparison.

From FIG. 2, it will be appreciated that the oxide superconductor of the invention can be seen as having an integral ratio of the superconductor of about 80%, which is higher by about 30% or over than the oxide superconductor for comparison whose integral ratio of the superconductor is at about 50% and which contains an impurity carbon content of 2.10%.

Moreover, FIG. 3 reveals that the oxide superconductor of the invention has a superconducting critical temperature at 98° K, which is apparently higher than 94° K of the oxide superconductor for comparison.

From FIG. 4, it will be seen that when the transition width of the superconduction ($\Delta T$) is judged from the difference between the temperature at which a diamagnetic signal commences and the temperature at which 80% of a susceptibility based on the susceptibility at 5° K is arrived, the oxide superconductor of the invention has a superconducting transition width ($\Delta T_2$) which is as small as only 6° K when compared with the oxide superconductor for comparison having a superconducting transition width ($\Delta T_1$) as great as 22° K. It will be seen from the above point of view that the oxide superconductor of the invention has excellent superconducting characteristics.

EXAMPLE OF PRIOR ART

For the production of a $HgBa_2CuO_{4+\delta}$ oxide superconductor, the general procedure of Example 1 was repeated except that there were used commercially available HgO powder and a Ba—Cu—O oxide (precursor), which was obtained by mixing $BaO_2$ powder and CuO powder and calcining the resulting mixture in a stream of oxygen at 930° C., in place of the HgO powder, the CuO powder and the BaO powder, which was prepared by the specific procedure, all used as the starting materials in Example 1, thereby obtaining a $HgBa_2Cu_xO_{4+\delta}$ oxide superconductor.

After the thus obtained oxide superconductor was annealed in an atmosphere of oxygen at 300° C for 3 days in a usual manner, the resultant oxide superconductor (product) was subjected to measurements of the content of carbon impurity, the superconducting critical temperature and the stability with time.

The results of the measurements are shown in Table 3 along with the carbon content in the Ba-containing precursor and the preparation conditions of the oxide superconductor.

It will be noted that the carbon contents of the Ba-containing precursor and the oxide superconductor, and the superconducting critical temperature and stability with time of the oxide superconductor (product) were, respectively, measured and evaluated in the same manner as in Example 1.

TABLE 3

| Test No. | | Carbon Content in Ba-containing Precursor | Preparation Conditions of Oxide Superconductor | | Measurements and Evaluation of Product | | |
|---|---|---|---|---|---|---|---|
| | | | Sintering Temperature (° C.) | Sintering Time (Hours) | Carbon Content (atomic %) | Superconducting Critical Temperature | Stability with Time |
| Prior Art | 8 | 4.50 | 875 | 20 | 5.20 | 89.0 | Poor |
| | 9 | 5.80 | 650 | 20 | 6.90 | 84.0 | Very poor |

Upon comparing the result of Table 3 and the results of Example 1, it will be clear that the $HgBa_2CuO_{4+\delta}$ oxide superconductor of the invention has significantly better superconducting characteristics (superconducting critical temperature) and stability with time than the prior art counterpart.

EXAMPLE 2

In this example, $Nd(Nd_{1-x}Ba_x)_2Cu_3O_{6+\delta}$ (wherein $x \leq 1$) oxide superconductors were prepared using, as a Ba feed stock, BaO powders having different contents of C as indicated in Table 1 of Example 1.

For the preparation of the $Nd(Nd_{1-x}Ba_x)_2Cu_3O_{6+\delta}$ (wherein $x \leq 1$) oxide superconductors, commercially available $Nd_2O_3$ (purity: 99.99%) and CuO powder (purity: 99.999%) were provided and mixed with a BaO powder (one of A to G) indicated in Table 1 in a globe box filled with a highly pure, dried Ar gas having a content of carbon-containing gases (carbon dioxide, carbon monoxide and a hydrocarbon gas) of 0.1 ppm or below at compositional ratios of $Nd_2O_3$: BaO: CuO=[1+2(1-x)/2]:[2x]:[3], followed by shaping. The resultant shaped article was encapsulated in a quartz tube in vacuum (at a degree of vacuum of $10^{-2}$ Torr or below), followed by heating and sintering in a box-shaped electric furnace at different temperatures (the sintering time was at 20 hours). Thereafter, the resultant products were immersed in cold water at 10° C. and thus quenched.

After the quenching, the quartz tube was opened, and the resultant oxide superconductor was annealed in an atmosphere of oxygen at 300° C. for 3 days in a usual manner.

The thus obtained $Nd(Nd_{1-x}Ba_x)_2Cu_3O_{6+\delta}$ ($x \leq 1$) oxide superconductors (products) were subjected to measurement of a content of carbon impurity along with the superconducting critical temperature and stability with time of these oxide superconductors (products). The results are shown in Table 4 along with the preparation conditions of the oxide superconductors.

It will be noted that the carbon content, superconducting critical temperature and stability with time of the $Nd(Nd_{1-x}Ba_x)_2Cu_3O_{6+\delta}$ oxide superconductors (products) were, respectively, measured and evaluated in the same manner as in Example 1.

TABLE 4

| Test No. | | Starting BaO used (alphabetic symbol) | Preparation Conditions of Oxide Superconductor | | Measurements of Evaluation of Obtained Products | | |
|---|---|---|---|---|---|---|---|
| | | | Sintering Temperature (° C.) | Sintering Time (hours) | Carbon Content (atomic %) | Superconducting Critical Temperature (K) | Stability with Time |
| Inventive Example | 10 | A | 870 | 20 | 0.75 | 96.0 | Very good |
| | 11 | B | 870 | 20 | 0.80 | 95.5 | Very good |
| | 12 | C | 870 | 20 | 0.98 | 94.0 | Very good |
| | 13 | D | 870 | 20 | 1.25 | 92.0 | Good |
| Comparative Example | 14 | E | 870 | 20 | 2.05 | 86.0 | Moderate |
| | 15 | F | 850 | 20 | 3.10 | 85.0 | Moderate |
| | 16 | G | 820 | 20 | 4.50 | 83.0 | Poor |

The results of Table 4 reveal that the $Nd(Nd_{1-x}Ba_x)_2Cu_3O_{6+\delta}$ oxide superconductors of the invention, which have the low contents of carbon impurity, are better in superconducting characteristics and stability with time than the comparative products which have carbon impurity contents higher than 2.0%.

When the temperature dependence of susceptibility of these $Nd(Nd_{1-x}Ba_x)_2Cu_3O_{6+\delta}$ oxide superconductors was checked, it was confirmed that the oxide superconductors of the invention having a carbon impurity content of 2.0% or below not only exhibited a high superconducting critical temperature, but also had a sharp superconduction transition characteristic.

It will be noted that although $HgBa_2CuO_{4+\delta}$ oxide superconductors and $NdBa_2Cu_3O_{6+\delta}$ oxide superconductors alone were dealt with in the examples set forth hereinbefore, the excellent performance of oxide superconductors containing Ba as a constituent element and having a content of carbon impurity controlled at 2.0% or below and the usefulness of the method of stably producing such superconductors according to the invention were also confirmed with respect to other types of oxide superconductors containing Ba as the constituent element. In this sense, the examples should not be construed as limiting the invention thereto.

As described hereinabove, according to the invention, the oxide superconductors containing Ba as a constituent can be stably produced having excellent superconducting characteristics and stability with time. These superconductors can provide bulk articles, wire materials and thin films further improved in performance over prior art counterparts and are thus effective from the industrial point of view.

Especially, $HgBa_2Ca_{n-1}Cu_nO_y$ (wherein n=1, 2, 3 or 4) oxide superconductors and $Tl_2Ba_2Ca_{n-1}Cu_nO_y$ (wherein n 1, 2, 3 or 4) oxide superconductors, which have been expected as having high superconducting characteristics but with the problem that their satisfactory performance is not stably shown, are remarkably improved in performance, thus the invention is very effective.

What is claimed is:

1. An oxide superconductor consisting of an oxide of the chemical formula $$Nd(Nd_{1-x}Ba_x)_2Cu_3O_{6+\delta}$$

wherein $x \leq 1$ and having a content of carbon as an impurity at a level not greater than 2.0 atomic %.

2. The oxide superconductor of claim 1, wherein the content of carbon is from 0.3 to 2.0 atomic %.

3. The oxide superconductor of claim 1, wherein the oxide has the chemical formula $$NdBa_2Cu_3O_{6+\delta}.$$

4. The oxide superconductor of claim 1, wherein the content of carbon is not greater than 1.25 atomic %.

* * * * *